(12) United States Patent
Beaujuge et al.

(10) Patent No.: US 8,383,762 B2
(45) Date of Patent: Feb. 26, 2013

(54) BLACK SOLUBLE CONJUGATED POLYMERS WITH HIGH CHARGE CARRIER MOBILITIES

(75) Inventors: Pierre Marc Beaujuge, Berkeley, CA (US); John R. Reynolds, Gainesville, FL (US); Stefan Martin Ellinger, Visp (CH); Chad Martin Amb, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 13/130,697

(22) PCT Filed: Nov. 25, 2009

(86) PCT No.: PCT/US2009/065903
§ 371 (c)(1),
(2), (4) Date: May 23, 2011

(87) PCT Pub. No.: WO2010/062948
PCT Pub. Date: Jun. 3, 2010

(65) Prior Publication Data
US 2011/0251370 A1      Oct. 13, 2011

Related U.S. Application Data

(60) Provisional application No. 61/118,316, filed on Nov. 26, 2008.

(51) Int. Cl.
*C08G 75/00*      (2006.01)
(52) U.S. Cl. ............... 528/377; 528/380; 528/9; 528/27
(58) Field of Classification Search .................. 528/377, 528/380, 9, 27
See application file for complete search history.

(56) References Cited

U.S. PATENT DOCUMENTS

2007/0131270 A1*   6/2007   Gaudiana et al. ............. 136/244
2009/0108255 A1*   4/2009   Bazan et al. .................... 257/40

FOREIGN PATENT DOCUMENTS

| JP | 2007-227509 | 6/2007 |
| JP | 2008-231051 | 2/2008 |
| WO | WO 2007/087587 A2 | 8/2007 |

OTHER PUBLICATIONS

Abbel, R. et al. "Molecular Weight Optimum in the Mesoscopic Order of Chiral Fluorene (Co)polymer Films" *Macromolecules*, 2008, 41(20):7497-7504.
Beaujuge, P.M. et al. "The donor-acceptor approach allows a black-to-transmissive switching polymeric electrochrome" *Nature Materials*, Oct. 2008, 7:795-799.

(Continued)

*Primary Examiner* — Shane Fang
(74) *Attorney, Agent, or Firm* — Saliwanchik, Lloyd & Eisenschenk

(57) ABSTRACT

A soluble fused donor-acceptor conjugated polymer (fDA-CP) is prepared that absorbs light throughout nearly all the visible spectrum and is essentially black to the human eye when in the neutral state. The conjugated polymer has acceptor units that are isolated by a plurality of fused donor units. The fDA-CP assumes a conformation that results in a close π-stacking between adjacent lamella with a separation of less than 4.5 Å in the solid state and extended conjugation to promote high charge carrier mobilities. The fDA-CP is prepared by the polycondensation of a plurality of at least one fused donor-acceptor oligomer (fDA-oligomer) that has a flat internal acceptor unit and at least one fused donor unit incorporated in the oligomers, and optionally, an additional conjugated aromatic monomer or oligomer copolymerized with the fDA-oligomers.

26 Claims, 8 Drawing Sheets

OTHER PUBLICATIONS

Chuang, C.Y. et al. "Bright-White Light-Emitting Devices Based on a Single Polymer Exhibiting Simultaneous Blue, Green, and Red Emissions" *Macromolecules*, 2007, 40(2):247-252.

Havinga, E.E. et al. "Alternate Donor-Acceptor Small-Band-Gap Semiconducting Polymers; Polysquaraines and Polycroconaines" *Synthetic Metals*, 1993, 55-57:299-306.

Hou, J. et al. "Synthesis, Characterization, and Photovoltaic Properties of a Low Band Gap Polymer Based on Silole-Containing Polythiophenes and 2,1,3-Benzothiadiazole" *J. Am. Chem. Soc.*, 2008, 130(48):16144-16145.

Wang, E. et al. "High-performance polymer heterojunction solar cells of a polysilafluorene derivative" *Applied Physics Letters*, 2008, 92:033307-1 to 033307-3.

Wu, F.I. et al. "Efficient White-Electrophosphorescent Devices Based on a Single Polyfluorene Copolymer" *Adv. Funct. Mater.*, 2007, 17:1085-1092.

Zhou, E. et al. "Synthesis and Photovoltaic Properties of a Novel Low Band Gap Polymer Based on N-Substituted Dithieno[3,2-*b*:2',3'-*d*]pyrrole" *Macromolecules*, 2008, 41(22):8302-8305.

* cited by examiner (A)

(B)

(C)

(D)

BLACK SOLUBLE CONJUGATED POLYMERS WITH HIGH CHARGE CARRIER MOBILITIES

CROSS-REFERENCE TO RELATED APPLICATIONS

This application is the U.S. national stage application of International Patent Application No. PCT/US2009/065903, filed Nov. 25, 2009, which claims the benefit of U.S. Provisional Application Ser. No. 61/118,316, filed Nov. 26, 2008, the disclosures of which are hereby incorporated by reference in their entireties, including all figures, tables and drawings.

The subject invention was made with government support under the Air Force Office of Scientific Research, Contract No. FA9550-06-1-0192. The government has certain rights to this invention.

BACKGROUND OF THE INVENTION

Molecular systems involving electron rich and poor π-conjugated substituents have been synthesized for energy band mixing applications. These molecular systems have been explored for use as: light-emitting semiconductors; n-channel and ambipolar semiconductors for organic thin-film transistors; active organic components for chemical biosensors; non-emissive organic electrochromics; and low-bandgap photovoltaics absorbing in the visible and/or near infra-red (NIR) regions of the electromagnetic spectrum. Low-bandgap photovoltaics absorbing in the visible and/or near infrared (NIR) region have been pursued for the goal of designing bulk-heterojunction solar cells with high energy conversion. Donor-acceptor (DA) π-conjugated polymers that can be easily bandgap engineered via structural control and allow mechanical deformability are of interest to meet a demand for innovative high-performance flexible light-harvesting technologies. As opposed to the inorganic counterparts, DA π-conjugated polymers have the potential for low-cost scalability and high-throughput solution processing, particularly in solar cell's ultimate applications that require a large-area, for example in car and housing exterior surfaces, or require finely printed photoactive arrays as in portable electronic devices.

Although the donor-acceptor type macromolecules were introduced by Havinga et al., *Synthetic Metals*, 1993, 55, (1), 299-306) more than a decade ago, only recently have conjugated polymers been synthesized that exhibit good performance for use in photovoltaic cells (up to 5% of overall efficiency). Typically, DA polymers have displayed low power conversion efficiencies. This inefficiency can be attributed to two factors. The first factor being that the DA polymer's light absorption is generally limited to a small portion of the visible spectrum, typically the red region. The other factor is that the DA polymers have displayed low intrinsic charge carrier mobility in solid state devices.

There have been few disclosures of systems that achieve absorption over a large portion of the visible spectrum, and hence are essentially black. Nearly all polymeric systems that have been designed for full spectrum visible absorption have relied on having only a small number of broadly absorbing chromophores or have multiple chromophores with sharp absorption features evenly spread over the visible spectrum. The first solar cell systems that involve an all organic polymer semiconductor absorbing throughout the visible spectrum have only recently been reported, and even these systems do not absorb strongly (>50% of the peak absorption) over the entire visible range. (see Hou et al. *J. Amer. Chem. Soc.* published on the world wide web on Nov. 7, 2008, for alternating copolymer poly[(4,4'-bis(2-ethylhexyl)dithieno[3,2-b:2',3'-d]silole)-2,6-diyl-alt-(2,1,3-benzothiadiazole)-4,7-diyl] (PSBTBT) and Wang et al., *Appl. Phys. Lett.* 2008, 92, 033307 for alternating copolymer poly[(2,7-dioctylsilafluorene)-2,7-diyl-alt-(4,7-bis(2-thienyl)-2,1,3-benzothiadiazole)-5,5'-diyl] (PSiFDTBT))

The typical strongly absorbing DA polymers have displayed limited charge carrier mobilities due to a lack of favorable intermolecular interactions, specifically poor π-stacking due to large chain-to-chain distances, also called lamellar spacing, along with a lack of extended conjugation because of a low level of planarity of the polymer main-chains. High charge carrier mobilities are required for bulk-heterojunction solar cells as photo-generated excitons or geminate electron-hole pairs must undergo diffusion and dissociation processes within the active layer of the device and a rapid transport of the dissociated charges to collection electrodes. In absence of high charge carrier mobilities, the dissociated charges recombine before collection resulting in a device that displays poor solar energy conversion.

Hence an essentially black DA polymer system that absorbs strongly throughout the visible spectrum and displays good π-stacking with extended conjugation for high charge carrier mobilities remains a goal in the development of large area flexible light harvesting devices such as solar cells.

BRIEF SUMMARY OF THE INVENTION

Embodiments of the invention are directed to soluble fused donor-acceptor conjugated polymers (fDA-CPs) that have isolated acceptor units, which are electron poor aromatic moieties, adjacent to and separated by a plurality of fused donor units containing solubilizing side chains. The fDA-CP absorbs light throughout the visible spectrum appearing black to the human eye. Because of their structure, π-stacking of adjacent polymer chains occurs with solid state interlamella separation of less than 4.5 Å, and can approach that of graphene planes of graphite which are separated by 3.3 Å. In many embodiments of the invention fused donor units are present in even numbered monodispersed sequences between acceptor repeating units. In some embodiments the fused donor units can have the structure:

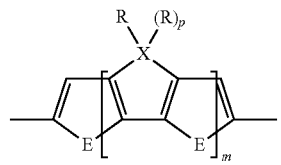

wherein E is —CH=CH—, S, Se, NH, NR, or Si; X is C, Si, or N; m is 1 to 5; p is 0 or 1; and R is linear or branched chain $C_{1-24}$ alkyl, linear or branched chain $C_{2-24}$ alkylenyl, or linear or branched chain $Si_{1-10}$ silane or siloxane substituted with H, methyl, $C_{2-6}$ alkyl, or aryl, or other solubilizing group. The acceptor units can be derivatives of thiadiazoloquinoxaline, quinoxaline, thienothiadiazol, thienopyrazine, pyrazinoquinoxaline, benzothiadiazole, bis-benzothiadiazole, or thiadiazolothienopyrazine. In some embodiments the acceptor units are 2,1,3-benzothiadiazole. In other embodiments additional conjugated aromatic units, for example unsubstituted thiophene units, can reside between the fused donor units. Exemplary structures for fDA-CPs according to embodiments of the invention include:

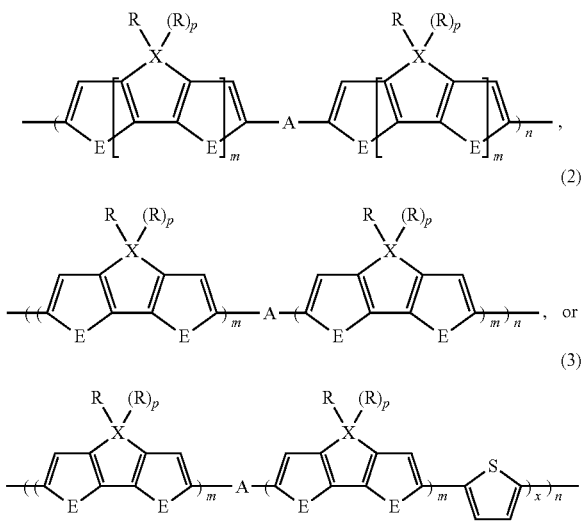

wherein A is an acceptor unit comprising an electron poor aromatic moiety; E is —CH=CH—, S, Se, NH, NR, or Si; X is C Si or N; n is 5 to 100; m is 1 to 5; x is 1 to 5; p is 0 or 1; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl, or other solubilizing group.

Other embodiments of the invention are directed to methods of preparation of fDA-CPs where a polymerization mixture having fDA-oligomers that have one or more acceptor units which have an electron poor aromatic moiety that are isolated by a fused donor units where donor units reside at each termini of the fDA-oligomer and are polymerized chemically to yield the fDA-CPs of type (1) or (2), above. The polymerization mixture can also contain a conjugated monomer or oligomer having at least one conjugated aromatic unit where fDA-CPs of type (3), above, are formed upon polymerization.

DETAILED DESCRIPTION OF THE INVENTION

Recently the inventors have developed a class of donor-acceptor electrochromic polymers (DA-ECPs) that exhibit absorption in the visible where multiple energy transitions are controlled by varying the relative contribution of electron rich and poor moieties incorporated in the repeat unit of the polymer such that the first black-colored polymeric electrochromes were achieved. The DA-ECPs have short and long wavelength bands that overlap and yields neutral state colored materials possessing various color hues and saturations, where at least two donor units separate acceptor units to yield a copolymer with an absorption spectrum that extends over the entire visible spectrum and resulting in a neutral state black polymer. The DA-ECPs are easily processed into electrochromic devices using convenient deposition methods, such as spin-coating, spray-casting, and a variety of printing methods (e.g. ink jet printing) due to the presence of solubilizing side chains. Absorption across the entire visible region of the neutral polymer, along with charge transport properties, allows the novel donor-acceptor conjugated polymers (DA-CPs) to be used for black colored solar cells.

The black neutral state DA-CP has a structure that contains isolated internal acceptor units, or isolated sequences of acceptor units, that are separated from other acceptor units by a sequence of two or more donor units. The absorption spectrum of the DA-CP depends upon the proportion of donor and acceptor units. In general, the wavelength difference for a low energy maximum absorption and a high energy maximum absorption of the DA-CP become smaller, while the absorption peaks retain or increase their breadth and achieve greater overlap as the wavelength maxima difference decreases. These polymers are disclosed in Beaujuge et al., International Application No. PCT/US2008/081606, filed Oct. 29, 2008, and attached herewith and incorporated by reference herein. Beaujuge et al. Nature Materials, 2008, 7, 795-9 illustrates the properties of black DA-CPs and is incorporated by reference herein.

The inventors have now discovered that by selecting donor repeating units of the DA-CP that are fused planer aromatics with in-the-plane or out-of-the-plane solubilizing side-chains, π-conjugated polymers can be formed that are effectively black in their neutral state and exhibit a high propensity to π-stack and/or order in the solid state. By judicious choice of these fused planar donors (fDs) and how they are positioned with respect to a electron poor aromatic acceptor repeating unit, the fused donor-acceptor conjugated polymers (fDA-CPs) assume conformations having long planar conjugated sequences in a manner such that π-stacking of adjacent polymer chains readily occurs with interlamella distances approaching those observed for graphene sheets in graphite of 3.3 Å. Some fDA-CPs according to embodiments of the invention are illustrated in FIG. 1 and are useful for solar cell applications.

Figure 1:
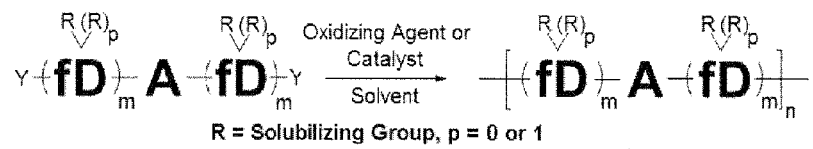
FIG. 1 shows the configurations of fused donors and acceptors according to embodiments of the invention that result in the black soluble conjugated polymers with high charge carrier mobilities.
Figure 1:
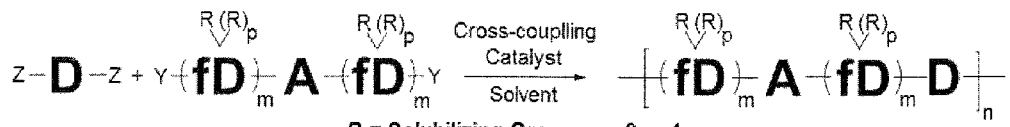

According to an embodiment of the invention, the repeating sequence of the polymer comprises an acceptor unit that is flanked on each side by at least one fD unit such that every non terminal acceptor is isolated from every other acceptor by at least two fD units, as illustrated in the second equation of FIG. 1. As in the DA polymers disclosed in Beaujuge et al., the features required for a neutral state polymer with strong absorbance across the visible range is achieved with the fDA- CPs disclosed herein, yet the employment of fDs rather than the D units of the exemplary polymers of Beaujuge et al. allows for an advantageous π-stacking of the fDA-CPs. Additionally the fD units supply a solubilizing side group which permits the solubilizing of the fDA-CPs in the solution state and can contribute to chain planarizing and π-stacking. In another embodiment of the invention, the two fD units or two sequences of fD units can be separated by a sequence of one or more conjugated repeating units as illustrated in the first equation of FIG. 1. In one embodiment of the invention all sequences of conjugated repeating units are monodispersed, and can be 1 to 5 repeating units in length. In embodiments of the invention, the fD units in a sequence on each side of the A unit can be 1 to 5 repeating units in length. In embodiments of the invention the sequences of fD units can be monodispersed.

Figure 2:
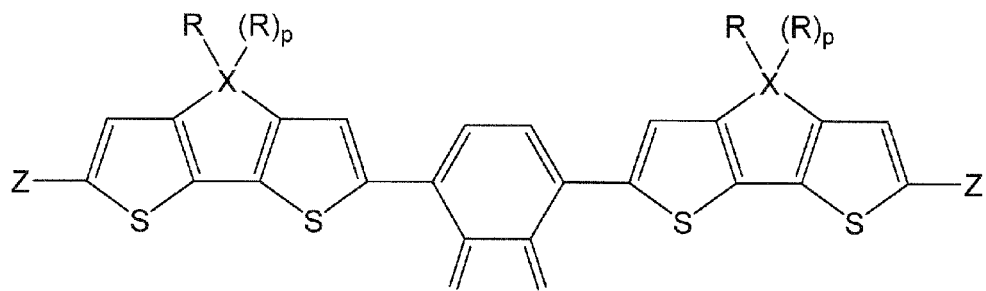
FIG. 2 shows fDA-oligomers according to embodiments of the invention that can be used for preparation of the fDA-CP according to embodiments of the invention.
Figure 2:
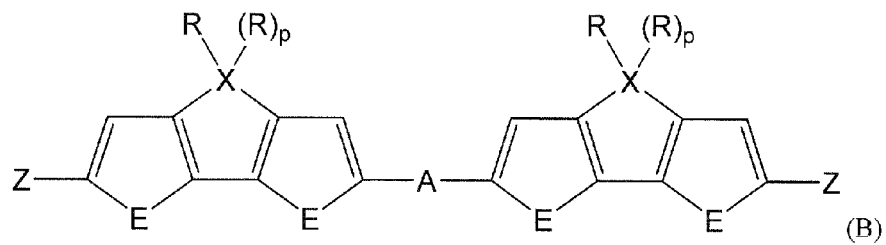
Figure 2:
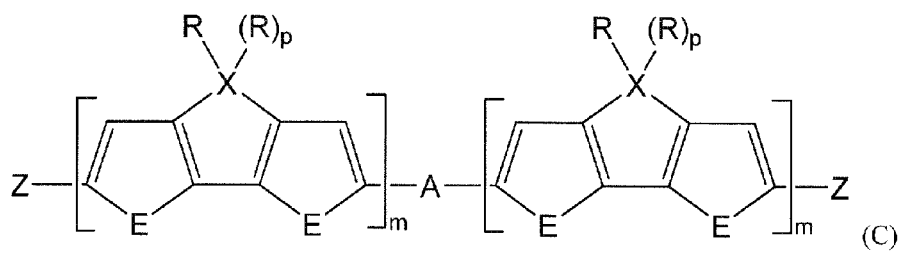
Figure 2:
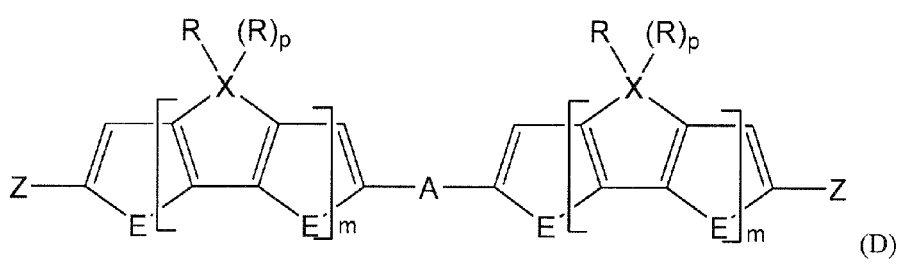

FIG. 2 illustrates oligomers that can be polymerized or copolymerized into the fDA-CP according to embodiments of the invention. The fD units can be a single fused donor with two aromatic units, as in (A) or (B), a single fused donor with multiple aromatic units, as in (D), or can be a plurality of fused donors as in (C). The MA-oligomer units can be of any structures in FIG. 2 where: m is 1 to 5; p is 0 to 1; E is S, NH, NR, Se, O, or —CH═CH—; X is C or Si, NH or NR; Z is H, Cl, Br, or I; and R is a solubilizing group including: a linear or branched alkyl chain for example, 1-24 carbon atoms and is, for example, methyl, ethyl, n-propyl, n-butyl, sec butyl, tert-butyl, n-hexyl, n-octyl, 2-ethylhexyl, n-nonyl, n-decyl, n-undecyl, n-dodecyl, n tridecyl, n-tetradecyl, n-hexadecyl, n-octadecyl or dodecanyl; or linear or branched alkenyl chain of 2-24 carbon atoms, for example, ethenyl, propenyl, butenyl, pentenyl, and the like. The alkyl or alkenyl can be interrupted, one or more times, by one or more oxygen atoms, sulfur atoms, —SO—, —SO$_2$—, carbonyl, —COO—, —CONH—, —NH—, —CON(C$_{1-8}$ alkyl)- or —N(C$_{1-8}$ alkyl)- and the like. For example, the alkyl group can be interrupted, one or more times, by one or more oxygen atoms, sulfur atoms, carbonyl, —COO—, —NH— or —N(C$_{1-8}$ alkyl)-. The uninterrupted or interrupted alkyl or alkenyl can also be substituted, one or more times, by one or more C$_{3-6}$ cycloalkyl groups, halogen, —OR', —COOR', —COOM, —SO$_3$M, —SO$_3$H, phosphonic acid, —CONR'R", —NR'R", phosphonate salt, ammonium salt or group of the formulae -L-Ar or —C(O)-L-Ar wherein: M is a nitrogen cation or metal cation; R' and R", independently of any other R' or R" that may be present is hydrogen; a group -L-Ar, —C(O)-L-Ar, or —C(O)—O-L-Ar; C$_{1-24}$ alkyl, C$_{3-24}$ alkenyl, C$_{3-6}$ cycloalkyl or C$_{1-24}$ alkylcarbonyl which is uninterrupted or interrupted, one or more times, by one or more oxygen atoms, sulfur atoms, carbonyl, —COO—, —CONH—, —NH—, —CON(C$_{1-8}$ alkyl)- or —N(C$_{1-8}$ alkyl)-, where uninterrupted or interrupted alkyl, alkenyl, cycloalkyl or alkylcarbonyl are unsubstituted or substituted, one or more times, by one or more halogen, —OH, C$_{7-12}$ aralkyl, C$_{2-12}$ alkylcarbonyl, C$_{1-24}$ alkoxy, C$_{2-24}$ alkylcarboxy, —COOM, —CONH$_2$, —CON(H)(C$_{1-8}$ alkyl), —CON(C$_{1-8}$ alkyl)$_2$, —NH$_2$, —N(H)(C$_{1-8}$ alkyl), —N(C$_{1-8}$ alkyl)$_2$, —SO$_3$M, phenyl, phenyl substituted, one or more times, by one or more C$_{1-8}$ alkyl, naphthyl, naphthyl substituted, one or more times, by one or more C$_{1-8}$ alkyl ammonium salt, phosphonic acid or phosphonate salt or when attached to a nitrogen atom, R' and R", together with the nitrogen atom to which they are attached, form a 5-, 6- or 7-membered ring that is uninterrupted or interrupted by —O—, —NH— or —N(C$_{1-12}$ alkyl)-; and L is a direct bond or C$_{1-12}$ alkylene that is uninterrupted or interrupted by one or more oxygen atoms and is unsubstituted or substituted, one or more times, by one or more —OH, halogen, C$_{1-8}$ alkyl, C$_{1-24}$ alkoxy, C$_{2-24}$alkylcarboxy, —NH$_2$, —N(H)(C$_{1-8}$ alkyl), —N(C$_{1-8}$ alkyl)$_2$ or ammonium salt. R can be a silane or siloxane chain of 1 to 10 Si atoms where the Si atoms have substituents that are: C$_{1-12}$ alkyl group; an aryl group; heteroaryl group; H; OR' or OC(O)R' where R' is an alkyl group; an aryl group; or heteroaryl group.

Figure 3:
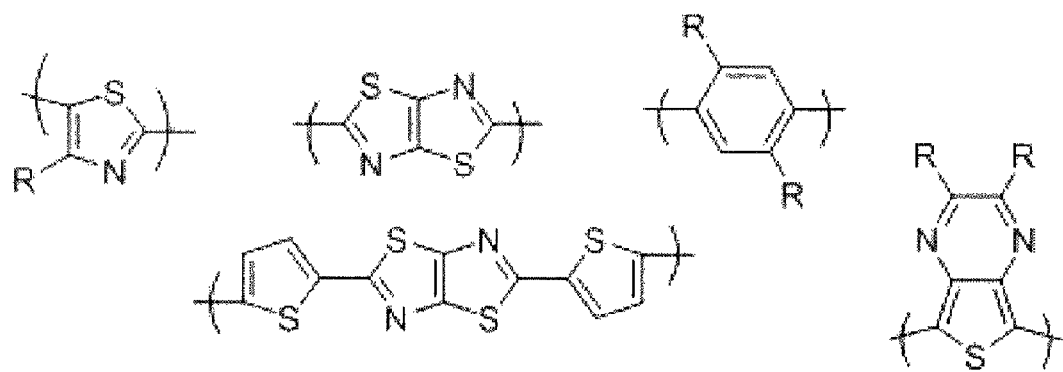
FIG. 3 shows some exemplary conjugated units that can reside as a monomeric or oligomeric unit of 2 to 5 between fD units of a fDA-CP according to embodiments of the invention.

The fD units can be separated by other fD units or by any other conjugated units. For example the fD units can be separated by mono- or oligo-thiophene units. For example, other conjugated units that can be used include: mono- or oligo-phenylene; mono- or oligo-carbazole; mono- or oligo-fluorene; mono- or oligo-pyrrole; mono- or oligo-furan; mono- or oligo-thiazolothiazole units; or any combination thereof according to embodiments of the invention. Some exemplary conjugated mono-units that can be used according to embodiments of the invention are illustrated in FIG. 3.

The solubilizing groups of the fD units can be those which can be converted from a solubilizing unit to one that is insoluble, in the manner described in "The Chemical Defunctionalization of Polymeric Alkylenedioxyheterocyclics" by Reynolds et. al., International Application No. PCT/US2007/061016; filed Jan. 25, 2007 and published as International Publication No. WO 2007/087587 A2 on Aug. 2, 2007, and incorporated herein by reference. By using such aolubilizing groups on the fD repeating units, the soluble fDA-CP can be converted into an insoluble fDA-CP for applications where the environment of the device employing the fDA-CP would not be conducive to the use of a soluble fDA-CP, yet the ability to fabricate the device from solution before chemical defunctionalization allows the desirable solution processable features of the present invention.

Figure 4:
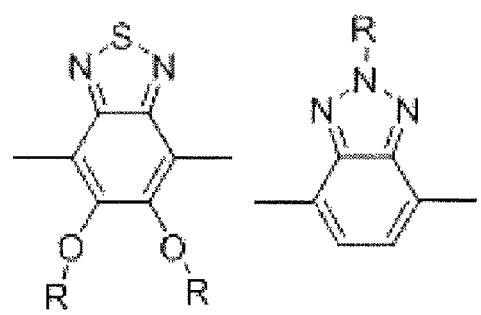
FIG. 4 shows two exemplary substituted acceptor units of fDA-CP according to embodiments of the invention.

As shown in FIGS. 1 and 2, the A units of the YfD$_m$AfD$_m$Y can be 2,1,3-benzothiadiazole (BTD) (specifically shown in FIG. 2), derivatives of thiadiazoloquinoxaline, quinoxaline, thienothiadiazol, thienopyrazine, pyrazinoquinoxaline, benzobisthiadiazole, thiadiazolothienopyrazine, benzotriazole and/or other electron poor aromatic acceptor units. In some embodiments of the invention, the acceptor unit is a planar repeating unit to promote π-stacking. In some embodiments of the invention the acceptor unit can be substituted, as illustrated for the substituted benzothiadiazole and benzotriazole acceptors shown in FIG. 4.

Figure 5:
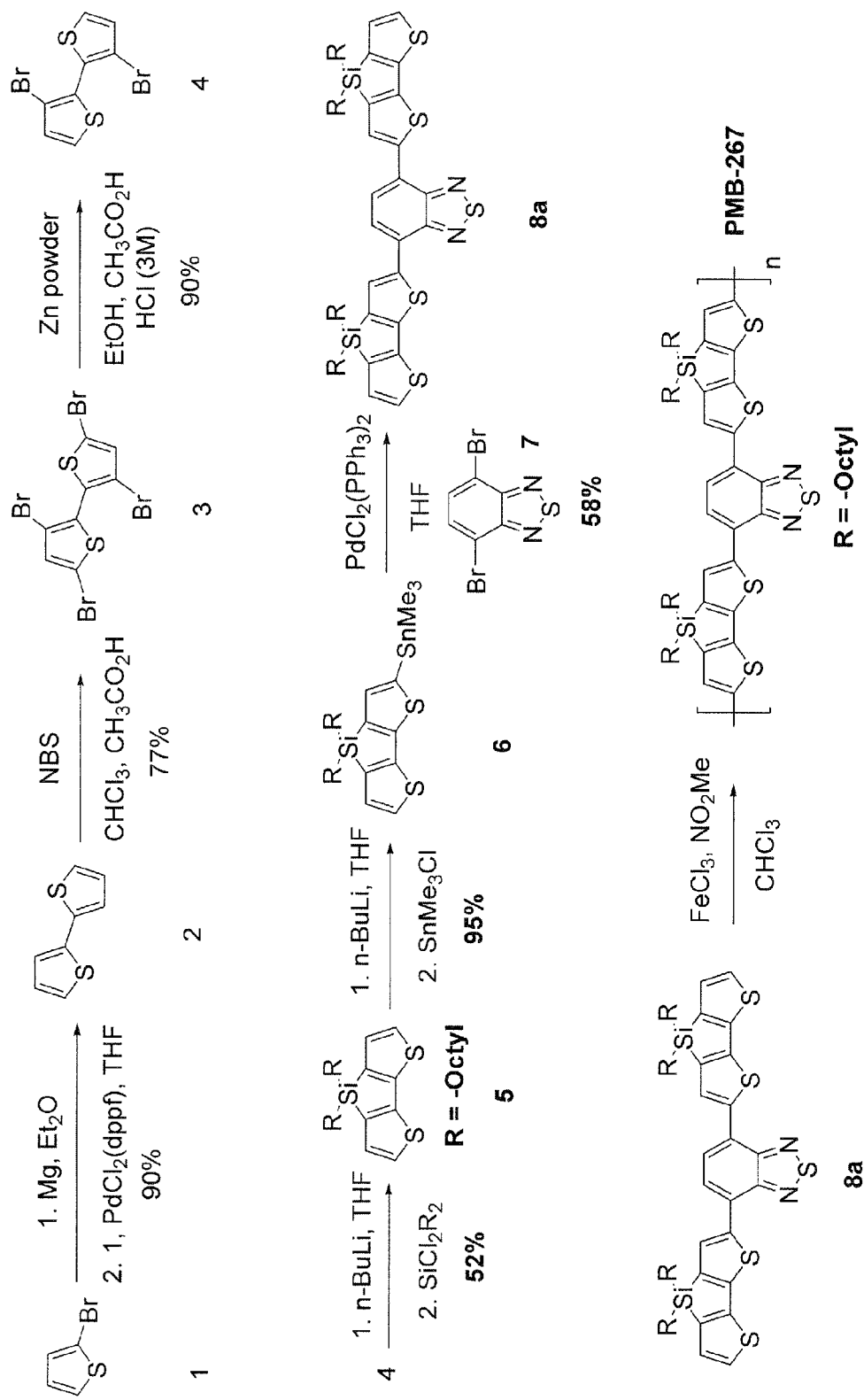
FIG. 5 shows exemplary methods according to embodiments of the invention for preparation of fDA-CP.
Figure 5:
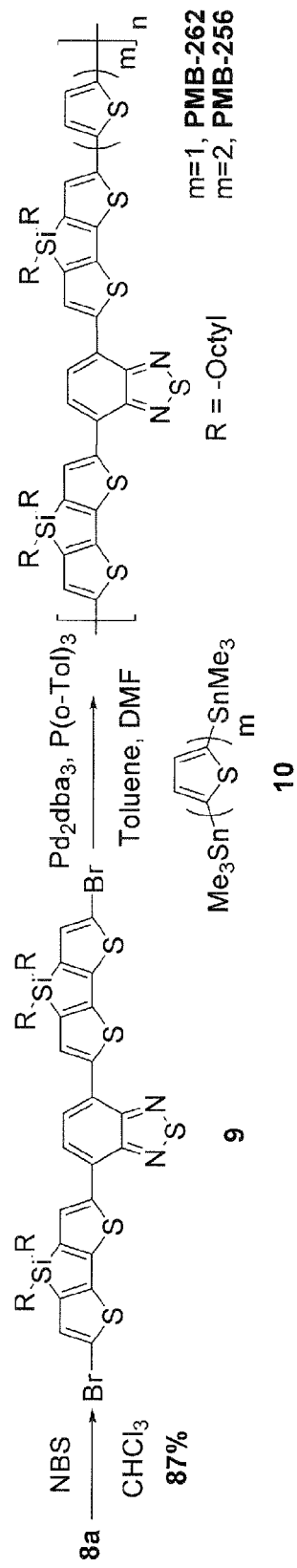

FIG. 5 illustrates a method to prepare one fDA-CP according to an embodiment of the invention. The synthesis of an fD unit according to an embodiment of the invention has two thiophene units coupled and fused by the incorporation of a Si atom as the tetravalent unit is illustrated where 2-bromothiophene 1 is converted in 5 steps to provide a fD unit with a single reactive functionality 6, which can then be combined with a difunctional A unit 7 to form the fDA-oligomer 8a. The yields given in FIG. 5 are for R=octyl. The fDA-oligomers 8a can be self-condensed to form a polymer PMB-267 as shown in FIG. 5 or can be cross-condensed with another conjugated monomer 10, m=1, or conjugated oligomer 10, m=2, where 8a is converted to an oligomer 9 with complementary functionality to that of 10 to yield PMB-262 or PMB-262, respectively. In these exemplary embodiments of the invention, as given in Table 1, below, number average molecular weights were found to be in excess of 15,000 g/mol with relatively low polydispersity indexes (PDI) for such materials. Elemental analysis (EA) agrees strongly with the calculated EA for the designed fDA-CP structures.

TABLE 1

Gel Permeation Chromatographic Characterization and Elemental Analysis of fDA-CPs for the polymers of FIG. 5.

| Polymer | g/mol | | | | EA (Calcd/Found) | | |
| --- | --- | --- | --- | --- | --- | --- | --- |
| | $M_n$ | $M_w$ | PDI | DP | C | H | N |
| PMB-267 | 17,700 | 59,200 | 3.3 | 18 | 67.02/ | 7.71/ | 2.89/ |
| | | | | | 66.61 | 7.52 | 2.91 |
| PMB-256 | 19,800 | 64,100 | 3.2 | 17 | 65.79/ | 6.95/ | 2.44/ |
| | | | | | 66.13 | 7.19 | 2.47 |
| PMB-262 | 16,000 | 59,200 | 3.8 | 15 | 66.36/ | 7.30/ | 2.67/ |
| | | | | | 66.81 | 7.45 | 2.51 |

Figure 6:
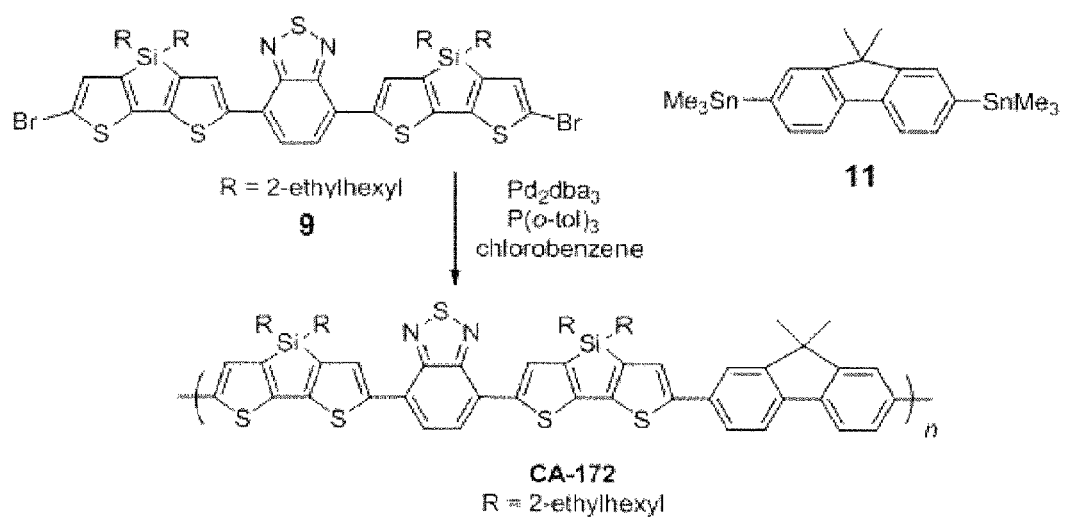
FIG. 6 shows exemplary methods according to embodiments of the invention for preparation of fDA-CP having a non-thiophene conjugated repeating unit between fD units.

As shown in FIG. 6, according to an embodiment of the invention, the conjugated monomer that can be cross-condensed with 9 can be a non-thiophene monomer, for example a 2,7-bis(trimethylstannyl)-9,9-dimethylfluorene 11. As in all cases, the cross-condensation is carried out such that a plurality of fD-unit separates every acceptor A unit in the copolymer.

Figure 7:
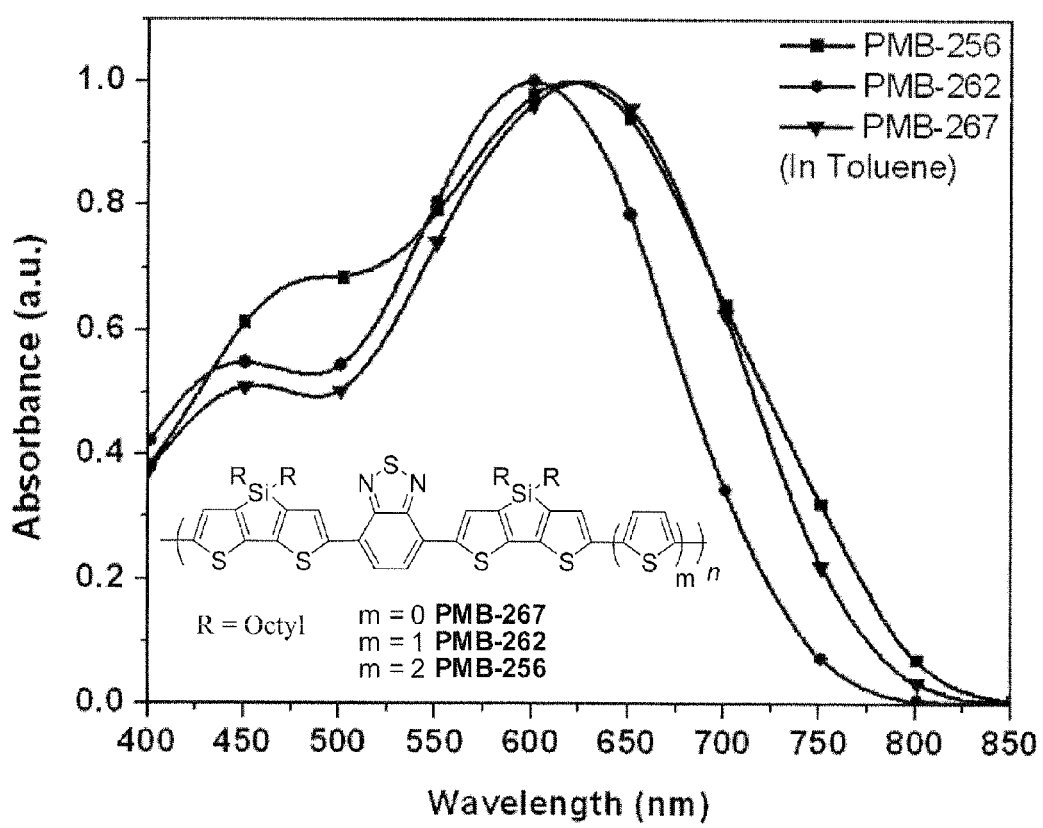
FIG. 7 shows a composite of visible absorption spectra for three fDA-CPs according to embodiments of the invention, which display absorbance of more than 50% of the peak absorbance throughout nearly the entire visible spectrum.
Figure 8:
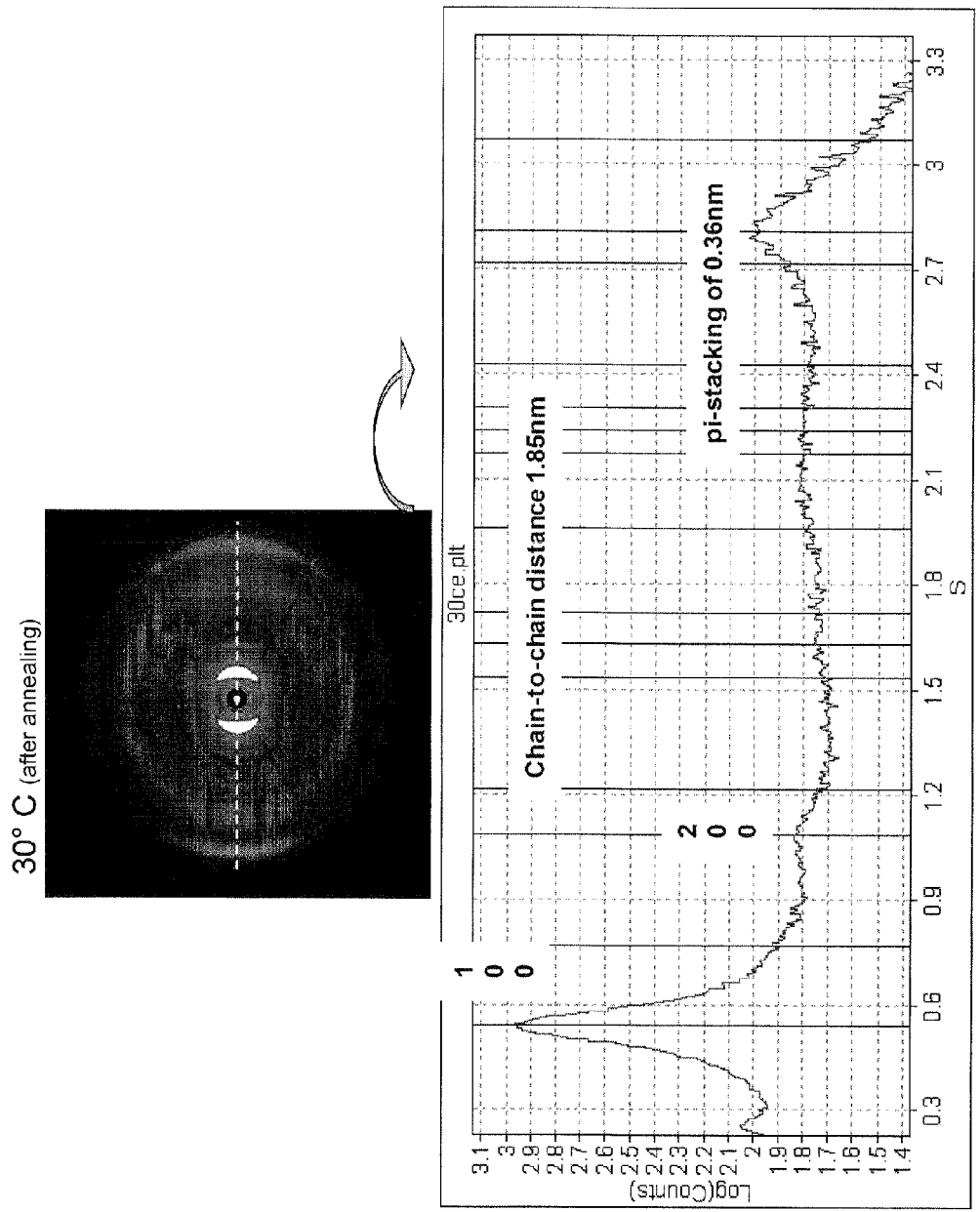
FIG. 8 shows a 2-dimensional wide angle x-ray scattering (WAXS) pattern of filament extruded fDA-CP PMB-256 and its corresponding x-ray plot that shows a π-stacking of lamella with a separation of 3.6 Å.

The fDA-CP display strong absorbance over the entire visible region as can be seen in FIG. 7. The absorbance of light at about 450 nm is over 50% of the maximum absorbance at 600-650 nm, indicating that the polymers according to embodiments of the invention have the potential for harvesting solar energy throughout the visible light range. The 2-D wide angle x-ray spectrum (WAXS) and plot of the chain-to-chain distances for PMB-256 is shown in FIG. 8. This plot indicates that the chains are π-stacked with the plane of one fDA-CP being 3.6 Å from the plane of an adjacent fDA-CP, which is similar to the distance of 3.3 Å for graphene sheets of graphite. Hence these symmetric novel FDA-CP with at least two donor units between each acceptor units appear to have nearly optimal π-stacking that also requires that long sections of the polymer resides in a conformation that gives extended planar sections where the π-orbitals of a given fDA-CP have extensive overlap. In one embodiment of the invention the solid state interlamella separation is less than 4.5 Å. In another embodiment of the invention the solid state interlamella separation is less than 4 Å. In another embodiment of the invention the solid state interlamella separation is less than 3.8 Å. In another embodiment of the invention the solid state interlamella separation is about 3.6 Å.

The fDA-CPs can be used in polymeric solar cell applications; photovoltaic devices; photodetectors and light sensors, anti-stat conductors, transparent conductors, field effect transistors, supercapacitors, batteries and other electronic components. As the absorption of light includes a larger proportion of the visible spectrum and the charge carrier mobilities are higher than other polymeric systems, superior efficiencies of light harvesting are possible for the fDA-CPs of various embodiments of the invention.

MATERIALS AND METHODS

Preparation of 3,3'-di-(2-ethylhexy)silylene-2,2'-bithiophene 5 To a solution of 2.5M n-BuLi in hexanes (22.2 mL, 55.6 mmol) in diethyl ether (300 mL) cooled to −78° C. was added a solution of 3,3'-dibromo-2,2-bithiophene 4 (8.2 g, 25.3 mmol) in 100 mL THF. The mixture was stirred at this temperature for 3 h, then a solution of dichlorobis(2-ethylhexyl)silane (9.05 g, 27.8 mmol) in THF (100 mL) was added. This mixture was slowly allowed to warm to room temperature overnight. The reaction mixture was then poured into 300 mL water, extracted with hexanes (3×150 mL), dried over $MgSO_4$, and evaporated. The residue was first purified by silica gel chromatography (hexanes), and then further purified by Kugelrohr distillation (BP~175 C, 0.05 torr) to give 3.2 g (30%) of a faint yellow liquid. $^1$H NMR (500 MHz, $CDCl_3$) δ 7.19 (d, J=5.5 Hz, 2H), 7.04 (d, J=5.5 Hz, 2H), 1.41 (m, 2H), 1.20 (m, 16 μl), 0.94 (t, J=6.0 Hz, 4H), 0.82 (t, J=7.0 Hz, 6H), 0.76 (t, J=7.0 Hz, 6H). $^{13}$C NMR (125 MHz, $CDCl_3$) δ 149.2, 142.8, 130.1, 125.2, 36.2, 35.9, 29.2, 29.1, 23.2, 18.0, 14.5, 11.1. Elemental Analysis Calc. for $C_{24}H_{38}S_2Si$: C, 68.83; H, 9.15. Found C, 68.50; H, 9.40. HRMS (APCI) Calc. [M-H$^+$] 419.2257. Found 419.2275.

Preparation of 5-trimethylstannyl-3,3'-di-(2-ethylhexy)silylene-2,2'-bithiophene 6 3,3'-di-(2-ethylhexyl)-2,2'-bithiophene 5 (1.96 g, 4.68 mmol) was dissolved in dry THF (120 mL) and cooled down to −78° C. A solution of 2.5M n-butyllithium in hexanes (1.95 mL, 4.91 mmol) was added over a 30 min period and the mixture was stirred for 3 hours at −78° C. This solution was allowed to warm to 0° C. then cooled to −78° C. Trimethyltinchloride (1.21 g, 6.08 mmol) was subsequently added as a solid, the mixture was allowed to warm up to room temperature and stirred for 16 hours. The solvent was then evaporated affording a yellow-brown residue which was taken up in ~20 mL hexanes and filtered through a short plug of silica gel (the silica gel had been treated with neat triethylamine and washed thoroughly with hexanes prior to use) and the plug as washed with ~100 mL more hexanes. The solvent was then evaporated to give 2.45 g (90%) of a light yellow oil, which was used without further characterization or purification.

Preparation of 8a A 250 mL flask was charged with 5-trimethylstannyl-3,3'-di-(2-ethylhexy)silylene-2,2'-bithiophene 6 (1.70 g, 2.92 mmol), 4,7-dibromobenzo[c][1,2,5]-thiadiazole 7 (0.43 g, 1.46 mmol), $Pd_2dba_3$ (26 mg, 0.029 mmol), and P(o-tol)$_3$ (35 mg, 0.117 mmol). This was evacuated and backfilled with argon 4 times, then toluene (150 mL) was added. The mixture was heated to 80° C. overnight. The toluene was then removed by rotary evaporation and the resulting residue was purified by silica gel chromatography (hexanes) to give 1.09 g (78%) of a purple viscous oil. $^1$H NMR (500 MHz): δ 8.13 (t, J=5.0 Hz, 2H)* 7.85 (s, 2H), 7.26 (d, J=5.0 Hz, 2H), 7.09 (d, J=5.0 Hz, 2H) 1.48 (m, 4H), 1.20 (m, 32H), 1.05 (m, 8H), 0.85 (m, 24H). $^{13}$C NMR (125 MHz): δ 152.7, 150.5, 149.1, 144.2, 143.5, 140.3, 130.5, 130.2, 126.1, 126.0, 125.1, Elemental Analysis: Calc. for $C_{54}H_{76}N_2S_5Si_2$ C, 66.89; N, 2.89; H, 7.90. Found C, 66.86; N, 2.82; H, 8.17. HRMS (ESI) Calc. [M-H$^+$] 969.4223. Found 969.4229.

*Not a true triplet, but different peaks are caused by three different possible diastereomers of the DTS with the 2-ethylhexyl group (R,R), (R,S), (S,S). Because of the racemic mixture used to generate the DTS starting material, there is a 1:2:1 population of the respective diastereomers giving rise to the 1:2:1 ratio on the peak at 8.13.

Preparation of 9 To a solution of 8a (1.63 g, 1.68 mmol) in $CHCl_3$ (75 mL) cooled to 0° C. was added a solution of NBS (0.598 g, 3.36 mmol) in MeCN (50 mL) over 40 minutes. This was stirred another hour at 0° C. and then poured into water (100 mL), extracted with $CHCl_3$ (3×150 mL), dried over $MgSO_4$, and evaporated. The residue was purified by silica gel chromatography (hexanes) to give 1.68 g (89%) of viscous purple oil. $^1$H NMR (500 MHz): δ 8.10 (t, J=5.0 Hz, 2H)* 7.83 (s, 2H), 7.04 (t, J=1.5 Hz, 2H), 1.48 (m, 4H), 1.20 (m, 32H), 1.05 (m, 8H), 0.85 (m, 24H). $^{13}$C NMR (125 MHz): δ 152.5, 149.6, 149.3, 143.0, 142.9, 140.5, 132.6, 130.2, 125.7, 125.0, 111.9, 35.9, 35.7, 35.7, 28.9, 23.2, 23.0, 14.1, 10.8. *Not a true triplet, but different peaks are caused by three different possible diastereomers of the DTS with the 2-ethylhexyl group (R,R), (R,S), (S,S). Because of the racemic mixture used to generate the DTS starting material, there is a 1:2:1 population of the respective diastereomers giving the 1:2:1 ratio on the peak at 8.10.

Preparation and isolation of PMB-267 Compound 8a (415 mg, 0.428 mmol) was dissolved in chloroform (50 mL). A solution of anhydrous FeCl$_3$ (347 mg, 2.14 mmol, 5 eq) in nitromethane was added dropwise over a period of 30 minutes to the stirred monomer at room temperature (the dark purple monomer solution turned progressively dark blue-green with addition of oxidizing agent). The mixture was stirred overnight at room temperature. It was then precipitated into methanol (200 mL). The precipitate was filtered, redissolved in chloroform (200 mL) and stirred for 3 hours with hydrazine monohydrate (6 mL). After evaporation, the concentrate (dark blue-green) was precipitated into methanol (200 mL), the precipitate was filtered through a Soxhlet thimble and purified via Soxhlet extraction for 24 hours with methanol. The polymer was extracted with chloroform, concentrated by evaporation, the polymer was precipitated in methanol (200 mL) and collected as a dark solid (170 mg, 41%). $^1$H NMR (300 MHz, CDCl$_3$) δ=8.14 (bs, 2H), 7.87 (bs, 2H), 7.00 (br, 2H), 1.50-0.80 (br, 68H). GPC analysis: M$_n$=17 700 g mol$^{-1}$. M$_w$=59 200 g mol$^{-1}$, PDI=3.35. Anal. calcd. for C$_{54}$H$_{74}$N$_2$S$_5$Si$_2$: C, 67.02; H, 7.71; N, 2.89. Found: C, 66.61; H, 7.52; N, 2.91.

Modified preparation and isolation of PMB-267 Compound 8a (519 mg, 0.535 mmol) was dissolved in 40 mL CHCl$_3$, and dry air was bubbled into the solution. A solution of anhydrous FeCl$_3$ (434 mg, 2.67 mmol) in 2 mL nitromethane was then added slowly dropwise over 2 hours under continued bubbling. This mixture was stirred and bubbled with air for 9 hours, and then the mixture was poured into methanol (200 mL) and stirred overnight. The precipitate was then filtered, washed with methanol and the solid was suspended in 250 mL chloroform and ~5 mL hydrazine monohydrate was added. This was stirred 1.5 h at room temperature, and then the solvent was evaporated to ~20 mL volume. This was then precipitated into methanol, filtered onto a cellulose thimble, and purified by soxhlet extraction with methanol (1 day), hexanes (1 day), chloroform (1 day), and chlorobenzene (until clear). The chloroform and chlorobenzene fractions were then precipitated into methanol and dried under vacuum to give 290 mg (56%) and 50 mg (10%) of dark solid product respectively. Chloroform fraction GPC (THF) Mn=29,770, Mw=75,300, PDI=2.53.

Preparation of PMB-262 2,5-Dibromothiophene (0.101 g, 0.421 mmol) was dissolved in dry THF (10 mL) and cooled down to −78° C. A solution of n-butyllithium in hexanes (0.405 mL, 1.011 mmol) was added over a 10 min period and the mixture was stirred for 1 hour at −78° C. A solution of trimethyltinchloride in hexanes (1.09 mL, 1.09 mmol) was subsequently added, the mixture was allowed to warm up to room temperature and stirred for 1 hour. The solvent was evaporated affording 10 where m=1 as a light orange residue which was used for the next step without further purification (~98%). Compound 9 (0.475 g, 0.421 mmol), Pd$_2$(dba)$_3$ (2 mol %) and P(o-tol)$_3$ (8 mol %) were added to the residue and dissolved in 12 mL of dry toluene and 1 mL of degassed anhydrous DMF. The mixture was stirred for overnight at 90° C. It was then precipitated into methanol (200 mL). The precipitate was filtered through a Soxhlet thimble and purified via Soxhlet extraction for 24 hours with methanol. The polymer PMB-262 was extracted with chloroform, concentrated by evaporation, and treated with a strongly complexing ligand (diethylammonium diethyldithiocarbamate) in order to remove any residual trace of catalyst before being precipitated in methanol (200 mL) and collected as a dark solid (180 mg, 41%). $^1$H NMR (300 MHz, CDCl$_3$) δ=8.12 (bs, 2H), 7.84 (bs, 2H), 7.00 (br, 4H), 1.50-0.80 (m, 68H). GPC analysis: M$_n$=15 900 g mol$^{-1}$, M$_w$=60 100 g mol$^{-1}$, PDI=3.8. Anal. calcd. for C$_{58}$H$_{76}$N$_2$S$_6$Si$_2$: C, 66.36; H, 7.30; N, 2.67. Found: C, 66.81; H, 7.45; N, 2.51.

Preparation of PMB-256 5,5'-Dibromo-2,2'-bithiophene (0.141 g, 0.434 mmol) was dissolved in dry THF (10 mL) and cooled down to −78° C. A solution of n-butyllithium in hexanes (0.416 mL, 1.04 mmol) was added over a 10 min period and the mixture was stirred for 2 hours at −78° C. A solution of trimethyltinchloride in hexanes (1.13 mL, 1.13 mmol) was subsequently added, the mixture was allowed to warm up to room temperature and stirred for 2 hours. The solvent was evaporated affording 10 where m=2 as a yellow-orange residue which was used for the next step without further purification (~98%). Compound 9 (0.489 g, 0.434 mmol), Pd$_2$(dba)$_3$ (2 mol %) and P(o-tol)$_3$ (8 mol %) were added to the residue and dissolved in 12 mL of dry toluene and 1 mL of degassed anhydrous DMF. The mixture was stirred for overnight at 90° C. It was then precipitated into methanol (200 mL). The precipitate was filtered through a Soxhlet thimble and purified via Soxhlet extraction for 24 hours with methanol. The polymer was extracted with chloroform, concentrated by evaporation, and treated with a strongly complexing ligand (diethylammonium diethyldithiocarbamate) in order to remove any residual trace of catalyst before being precipitated in methanol (200 mL) and collected as a dark solid (250 mg, 51%). $^1$H NMR (300 MHz, CDCl$_3$) δ=8.13 (bs, 2H), 7.85 (bs, 2H), 7.00 (br, 4H), 1.50-0.80 (m, 68H). GPC analysis: M$_n$=19 800 g mol$^{-1}$, M$_w$=64 100 g mol$^{-1}$, PDI=3.2. Anal. calcd. for C$_{62}$H$_{78}$N$_2$S$_7$Si$_2$: C, 65.79; H, 6.95; N, 2.44. Found: C, 66.13; H, 7.19; N, 2.47.

Preparation of 2,7-bis(trimethylstannyl)-9,9-dimethylfluorene 11 To a solution of 9,9'-dimethyl-2,7-dibromofluorene (0.75 g, 2.13 mmol) in THF (50 mL) at −78 C was added a solution of 2.5 M nBuLi in hexanes (3.4 mL, 8.5 mmol), and the solution was stirred 30 minutes. The solution was then warmed to 0 C and stirred 30 minutes. The solution was then cooled to −78 C and trimethyltin chloride (1.78 g, 8.9 mmol) was then added, and the solution was allowed to warm to room temperature. This was stirred overnight, and then the mixture was poured into water (100 mL) and extracted with Et$_2$O (3×100 mL). The combined organic extracts were dried over MgSO$_4$, filtered and evaporated. The residue was recrystallized 3 times from acetonitrile to give 0.45 g (40%) of a white solid. $^1$H NMR (500 MHz): δ 7.30 (dd, J=7.5 Hz, J=1 Hz, 2H), 7.57 (t, J=1 Hz, 2H), 7.48 (dd, J=7.5 Hz, J=1 Hz, 2H), 1.54 (s, 6H), 0.36 (s, 18H). $^{13}$C NMR (125 MHz): δ 153.1, 141.6, 139.7, 134.4, 130.0, 119.8, 47.1, 27.5, −9.1.

Preparation of CA-172 Compounds 9 and 11 were charged in a 50 mL Schlenk tube, and then a solution of Pd$_2$dba$_3$ (6.3 mg, 0.0069 mmol), and P(o-tol)$_3$ (10 mg, 0.033 mmol) in chlorobenzene (17 mL) was added. This mixture was heated to 130° C. for 5 days, cooled to RT, and precipitated into methanol. The precipitate was filtered onto a cellulose thimble, and purified by soxhlet extraction with methanol (1 day), hexanes (1 day), and chloroform. Diethylammonium dithiocarbamate was then added to the chloroform fraction and this was stirred one hour, and then the fraction was concentrated to ~50 mL, heated to near boiling, and filtered with a 0.45 mm PTFE syringe filter into 300 mL methanol. The precipitate was then collected, and redissolved in hot chloroform and the said filtration/reprecipitation process was repeated and the solid again collected. The solid was subjected to high vacuum overnight to give 83 mg (49%) of the dark solid. GPC (THF): $M_n$=21,135, $M_w$=31,580, PDI=1.49.

Structural Analysis

Fiber WAXS experiments were performed using a rotating anode (Rigaku 18 kW) X-ray beam with pinhole collimation and a 2D Siemens detector. A double graphite monochromator for the Cu Kα radiation (λ=0.154 nm) was used. The fibers were prepared by filament extrusion using a home-built mini-extruder at elevated temperatures. The extrusion was performed for 0.7 mm thin fibers by a constant-rate motion.

A θ-θ Siemens D500 Kristalloflex with a graphite-monochromatized CuKα X-ray beam was used for the investigation of the structure in the thin film. The diffraction patterns were recorded in the 2θ range from 1 to 34° and are presented as a function of the scattering vector s; with s=(2 sin θ)/λ where 2θ is the scattering angle.

All patents, patent applications, provisional applications, and publications referred to or cited herein, supra or infra, are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A soluble fused donor-acceptor conjugated polymer (fDA-CP) comprising isolated acceptor units comprising an electron poor aromatic moiety, wherein each of said acceptor units is adjacent to and separated by a plurality of fused donor units containing solubilizing side chains, wherein said fDA-CP absorbs light throughout the visible spectrum appearing black to the human eye and wherein π-stacking of adjacent polymer chains occurs with solid state interlamella separation of less than 4.5 Å.

2. The fDA-CP of claim 1, wherein said fused donor units comprise:

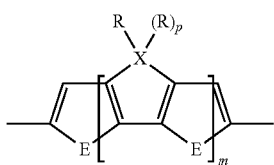

wherein E is —CH═CH—, S, Se, NH, NR, or Si; X is C, Si, or N; m is 1 to 5; p is 0 or 1; and R is linear or branched chain $C_{1-24}$ alkyl, linear or branched chain $C_{2-24}$ alkylenyl, or linear or branched chain $Si_{1-10}$ silane or siloxane substituted with H, methyl, $C_{2-6}$ alkyl, or aryl.

3. The fDA-CP of claim 1, wherein said acceptor units comprise at least one derivative of thiadiazoloquinoxaline, quinoxaline, thienothiadiazol, thienopyrazine, pyrazinoquinoxaline, benzothiadiazole, bis-benzothiadiazole, thiadiazolothienopyrazine, benzotriazole or any combination thereof.

4. The fDA-CP of claim 1, wherein said acceptor unit comprises 2,1,3-benzothiadiazole.

5. The fDA-CP of claim 1, wherein said fDA-CP comprises:

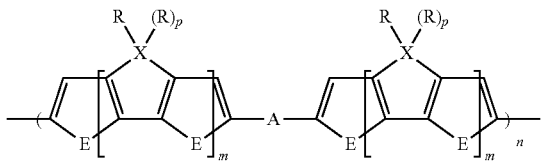

wherein A is an acceptor unit comprising an electron poor aromatic moiety; E is —CH═CH—, S, Se, NH, NR, or Si; X is C, Si, or N; n is 5 to 10,000; m is 1 to 5; p is 0 or 1; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl.

6. The fDA-CP of claim 1, wherein said fDA-CP comprises:

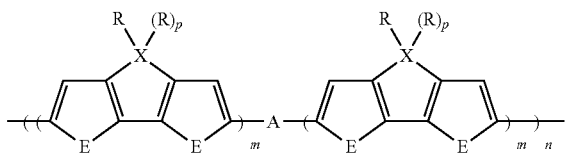

wherein A is an acceptor unit comprising an electron poor aromatic moiety; E is —CH═CH—, S, Se, NH, NR, or Si; X is C, Si, or N; n is 5 to 10,000; m is 1 to 5; p is 0 or 1; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl.

7. The fDA-CP of claim 1, further comprising one or more conjugated aromatic units between said fused donor units.

8. The fDA-CP of claim 7, wherein said conjugated repeating units comprise substituted or unsubstituted thiophene units.

9. The fDA-CP of claim 7, wherein said conjugated repeating units comprise substituted or unsubstituted phenylene units, carbazole units, fluorene units, pyrrole units, furan units, thiazolothiazole units, or any combination thereof.

10. The fDA-CP of claim 1, wherein said fDA-CP comprises:

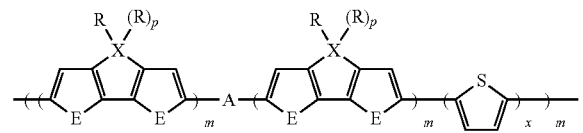

wherein A is an acceptor unit comprising an electron poor aromatic moiety; E is —CH═CH—, S, Se, NH, NR, or Si; X is C, Si, or N; n is 5 to 10,000; m is 1 to 5; x is 1 to 5; p is 0 or 1; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl.

11. The fDA-CP of claim 1, wherein said fDA-CP comprises:

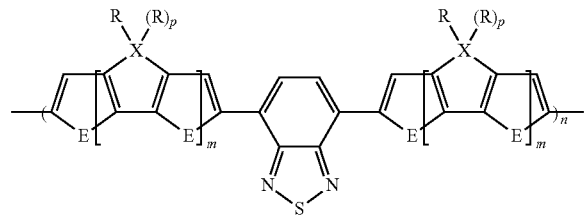

wherein E is —CH=CH—, S, Se, NH, NR, or Si; X is C, Si, or N; n is 5 to 10,000; m is 1 to 5; p is 0 or 1; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl.

12. The fDA-CP of claim 1, wherein said fDA-CP comprises:

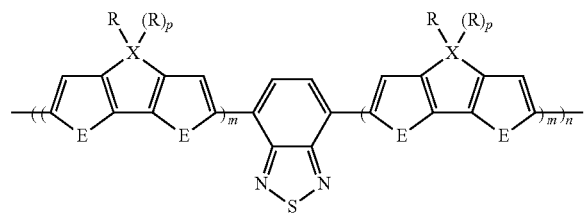

wherein E is —CH=CH—, S, Se, NH, NR, or Si; X is C, Si, or N; n is 5 to 10,000; m is 1 to 5; p is 0 or 1; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl.

13. The fDA-CP of claim 1, wherein said fDA-CP comprises:

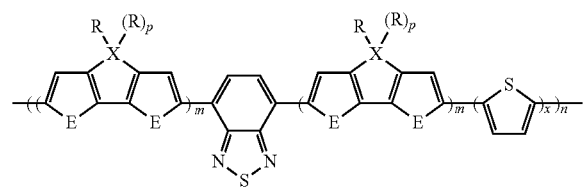

wherein E is —CH=CH—, S, Se, NH, NR, or Si; X is C, Si, or N; n is 5 to 10,000; m is 1 to 5; x is 1 to 5; p is 0 or 1; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl.

14. The fDA-CP of claim 1, wherein said fused donor units are present in even numbered monodispersed sequences between acceptor repeating units.

15. A method of preparing a soluble fused donor-acceptor conjugated polymer (fDA-CP) comprising the steps of:
providing to a polymerization mixture comprising a plurality of at least one fDA-oligomer comprising at least one isolated acceptor unit comprising an electron poor aromatic moiety flanked by fused donor units wherein at least one fused donor unit resides at each termini of said fDA-oligomer; and
polymerizing said polymerization mixture chemically, wherein said fDA-CP absorbs light throughout the visible spectrum and appears black to the human eye and wherein π-stacking of adjacent polymer chains occurs with solid state lamella separation of less than 4.5 ÅA in the solid state.

16. The method of claim 15, wherein said acceptor units comprise at least one derivative of thiadiazoloquinoxaline, quinoxaline, thienothiadiazol, thienopyrazine, pyrazinoquinoxaline, benzothiadiazole, bis-benzothiadiazole, thiadiazolothienopyrazine, or any combination thereof.

17. The method of claim 15, wherein said acceptor unit comprises 2,1,3-benzothiadiazole.

18. The method of claim 15, wherein said fDA-oligomer comprises:

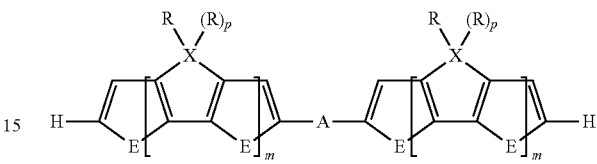

wherein A is an acceptor unit comprising an electron poor aromatic moiety; E is —CH=CH—, S, Se, NH, NR, or Si; X is C, Si, or N; m is 1 to 5; p is 0 or 1; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl.

19. The method of claim 15, wherein said fDA-oligomer comprises:

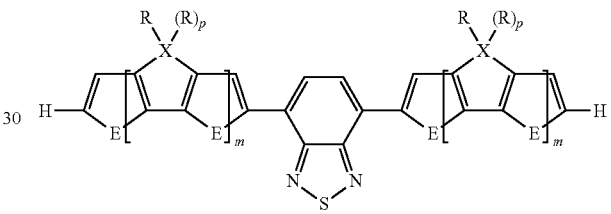

wherein E is —CH=CH—, S, Se, N, or Si; X is C or Si; m is 1 to 5; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl.

20. The method of claim 15, wherein said fDA-oligomer comprises:

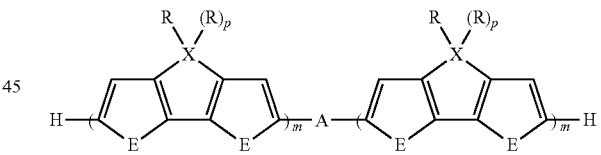

wherein A is an acceptor unit comprising an electron poor aromatic moiety; E is —CH=CH—, S, Se, NH, NR, or Si; X is C, Si, or N; m is 1 to 5; p is 0 or 1; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl.

21. The method of claim 15, wherein said fDA-oligomer comprises:

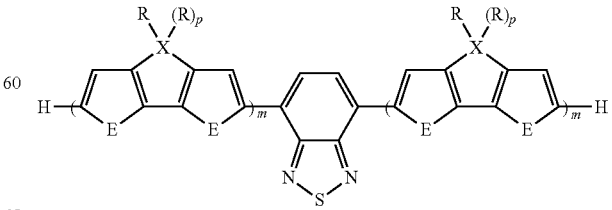

wherein E is —CH=CH—, S, Se, NH, NR, or Si; X is C, Si, or N; m is 1 to 5; p is 0 or 1; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl.

22. The method of claim 15, wherein said polymerization mixture further comprises a monomer or oligomer comprising at least one conjugated aromatic unit wherein said step of polymerizing said polymerization mixture results in said conjugated aromatic units being separated from said acceptor units by said fused donor repeating units of said fDA-oligomer.

23. The method of claim 22, wherein said fDA-oligomer comprises:

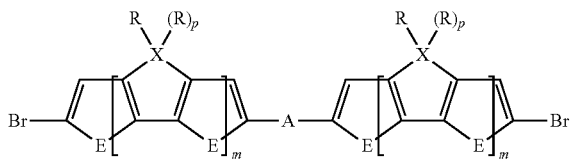

wherein A is an acceptor unit comprising an electron poor aromatic moiety; E is —CH=CH—, S, Se, NH, NR, or Si; m is 1 to 5; X is C or Si; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl, and wherein said monomer or oligomer comprising at least one conjugated repeating unit comprises:

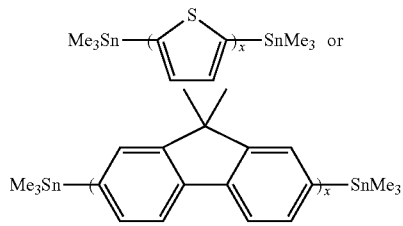

wherein x is 1 to 5.

24. The method of claim 22, wherein said fDA-oligomer comprises:

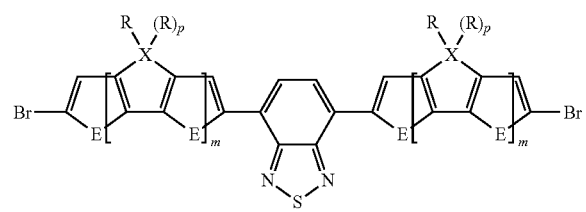

wherein E is —CH=CH—, S, Se, NH, NR, or Si; m is 1 to 5; X is C or Si; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl, and wherein said monomer or oligomer comprising at least one conjugated repeating unit comprises:

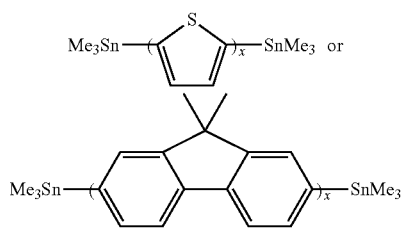

wherein x is 1 to 5.

25. The method of claim 22, wherein said fDA-oligomer comprises:

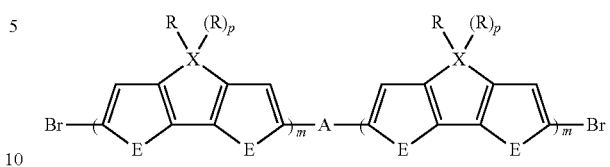

wherein A is an acceptor unit comprising an electron poor aromatic moiety; E is —CH=CH—, S, Se, NH, NR, or Si; m is 1 to 5; X is C or Si; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl and wherein said monomer or oligomer comprising at least one conjugated repeating unit comprises:

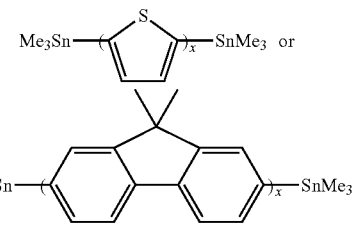

wherein x is 1 to 5.

26. The method of claim 22, wherein said fDA-oligomer comprises:

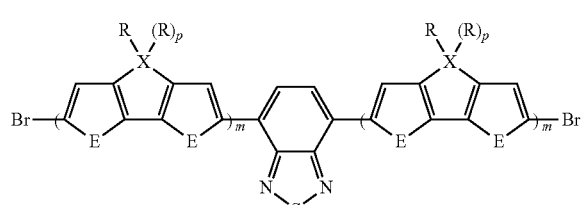

wherein E is —CH=CH—, S, Se, NH, NR, or Si; m is 1 to 5; X is C or Si; and R is straight or branched chain $C_{1-24}$ alkyl, straight or branched chain $C_{2-24}$ alkylenyl, or straight or branched chain $Si_{1-10}$ silane or siloxane substituted with H, methyl, $C_{2-6}$ alkyl, or aryl, and wherein said monomer or oligomer comprising at least one conjugated repeating unit comprises:

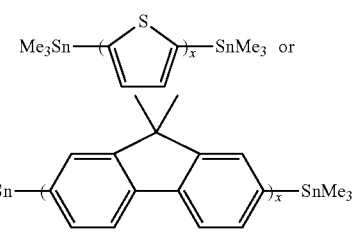

wherein x is 1 to 5.

* * * * *

UNITED STATES PATENT AND TRADEMARK OFFICE
CERTIFICATE OF CORRECTION

PATENT NO.        : 8,383,762 B2
APPLICATION NO.   : 13/130697
DATED             : February 26, 2013
INVENTOR(S)       : Pierre Marc Beaujuge et al.

It is certified that error appears in the above-identified patent and that said Letters Patent is hereby corrected as shown below:

In the Specification:

Column 1,
Line 45, "1993," should read --(1993,--.

Column 2,
Line 7, "(PSiFDTBT))" should read --(PSiFDTBT)).--.

Column 3,
Lines 20-22,

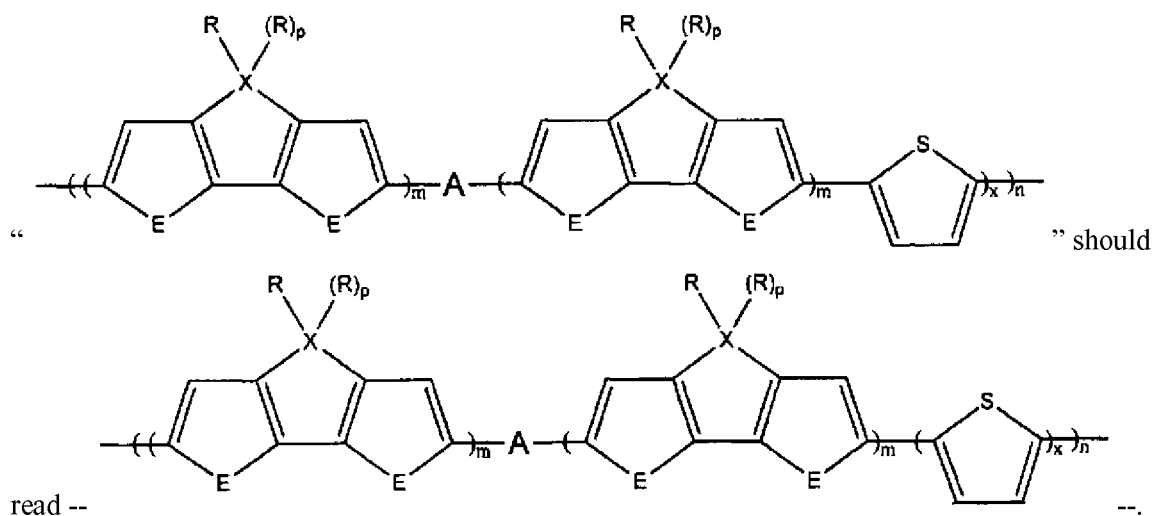

" should read -- -- --.

Column 5,
Line 8, "of ID units" should read --of fD units--.
Line 20, "The ID units" should read --The fD units--.
Line 23, "The MA-oligomer" should read --The fDA-oligomer--.

Signed and Sealed this
Seventeenth Day of September, 2013

Teresa Stanek Rea
*Deputy Director of the United States Patent and Trademark Office*

CERTIFICATE OF CORRECTION (continued)
U.S. Pat. No. 8,383,762 B2

Column 6,
Line 31, "aolubilizing" should read --solubilizing--.
Line 64, "PMB-262 or PMB-262" should read --PMB-262 or PMB-256--.

Column 7,
Line 63, "5 To a" should read --5 to A--.

Column 8,
Line 10, "(m, 16 μl)," should read --(m, 16 H),--.

Column 10,
Line 55, "J=1 Hz, 211)," should read --J= 1 Hz, 2H),--.

Column 12,
Lines 56-58,

" " should read -- -- .

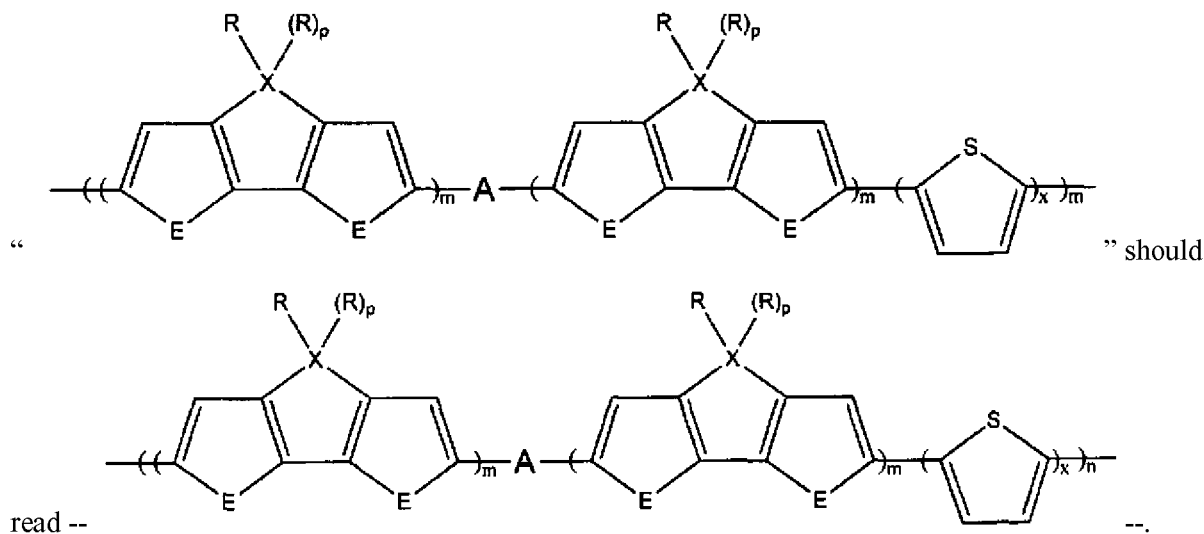

Column 13,
Line 66, " 4.5 ÅA in " should read -- 4.5 Å in --.

Column 14,
Line 39, "$C_{2-6}$ alkyl." should read --$C_{2-6}$ alkyl, or aryl.--.

Column 15,
Line 3, "$C_{2-6}$ alkyl." should read --$C_{2-6}$ alkyl, or aryl.--.